United States Patent [19]
Landgraf et al.

[11] Patent Number: 5,896,338
[45] Date of Patent: Apr. 20, 1999

[54] INPUT/OUTPUT POWER SUPPLY DETECTION SCHEME FOR FLASH MEMORY

[75] Inventors: Marcus E. Landgraf, Folsom; Robert E. Larsen, Shingle Springs; Mase J. Taub, Elk Grove; Sanjay Talreja; Vishram P. Dalvi, both of Folsom; Edward M. Babb, Rescue; Bharat M. Pathak; Christopher J. Haid, both of Folsom, all of Calif.

[73] Assignee: Intel Corporation, Santa Clara, Calif.

[21] Appl. No.: 08/837,001

[22] Filed: Apr. 11, 1997

[51] Int. Cl.$^6$ ................................................ G11C 13/00
[52] U.S. Cl. ............... 365/226; 365/185.33; 365/189.09
[58] Field of Search ................. 365/185.33, 189.01, 365/189.09, 226

[56] References Cited

U.S. PATENT DOCUMENTS

| | | | |
|---|---|---|---|
| 4,313,064 | 1/1982 | Claude | 307/475 |
| 4,617,479 | 10/1986 | Hartmann et al. | 307/465 |
| 4,774,421 | 9/1988 | Hartmann et al. | 307/465 |
| 5,153,452 | 10/1992 | Iwamura et al. | 365/226 |
| 5,223,751 | 6/1993 | Simmons et al. | 307/475 |
| 5,268,599 | 12/1993 | Matsui | 307/475 |
| 5,283,762 | 2/1994 | Fujishima | 365/189.09 |
| 5,298,807 | 3/1994 | Salmon et al. | 307/475 |
| 5,444,392 | 8/1995 | Sommer et al. | 326/31 |
| 5,477,172 | 12/1995 | Schnizlein | 327/99 |
| 5,528,172 | 6/1996 | Sundstrom | 326/80 |
| 5,532,620 | 7/1996 | Seo et al. | 326/81 |
| 5,534,801 | 7/1996 | Wu et al. | 327/72 |
| 5,568,062 | 10/1996 | Kaplinsky | 326/27 |
| 5,594,369 | 1/1997 | Kondoh et al. | 326/83 |

Primary Examiner—Terrell W. Fears
Attorney, Agent, or Firm—Blakely, Sokoloff, Taylor & Zafman LLP

[57] ABSTRACT

A power supply lockout circuit that prevents corruption of nonvolatile writeable memory data is described. The power supply lockout circuit monitors the power supply signals from several power supplies. The power supply lockout circuit locks out commands writing to the nonvolatile writeable memory when any one of the monitored power supply signals coupled to the nonvolatile writeable memory is below a specified signal level. The power supply lockout circuit includes a detector which provides a lockout signal to the nonvolatile writeable memory when a power supply signal is less than a prespecified voltage. The power supply lockout circuit also includes a sampling circuit which provides other lockout signals to the nonvolatile writeable memory when a different power supply signal is less than a reference voltage.

28 Claims, 7 Drawing Sheets

| I/O CONFIGURATION OR USAGE | V<sub>CC</sub> (INPUTS/CORE) | V<sub>CCQ</sub> (OUTPUTS) |
|---|---|---|
| 1.8 I/Os  302 | 2.7 - 2.85 VOLTS  306 | 1.8 - 2.2 VOLTS  304 |
| 3.0 I/Os  312 | 3.0 VOLTS  316 | 3.0 VOLTS  314 |

INPUT/OUTPUT POWER SUPPLY DETECTION SCHEME FOR FLASH MEMORY

FIELD OF THE INVENTION

This invention relates to systems including nonvolatile writeable memory. More particularly, this invention relates to controlling the quality of data written to nonvolatile writeable memory in an application with multiple separate power supplies coupled to the nonvolatile writeable memory.

BACKGROUND OF THE INVENTION

Many computing systems such as personal computers, automotive and airplane control, cellular phones, digital cameras, and handheld communication devices use nonvolatile writeable memories to store either data, or code, or both. Such nonvolatile writeable memories include Electrically Erasable Programmable Read-Only Memories ("EEPROMs") and flash Erasable and Electrically Programmable Read-Only Memories ("flash EPROMs" or "flash memories"). Nonvolatility is advantageous for allowing the computing system to retain its data and code when power is removed from the computing system. Thus, if the system is turned off or if there is a power failure, there is no loss of code or data.

The nonvolatile writeable memories often include a plurality of interconnected very large scale integration (VLSI) circuits. These VLSI circuits dissipate power in proportion to the nominal voltage swing of the binary signals applied to the circuits. The industry standard VLSI complementary metal-oxide-semiconductor (CMOS) circuits currently utilize two levels of input/output (I/O) signals, 1.8 volts and 3.0 volts. As the rail-to-rail voltage swing of standard CMOS circuits utilizing the 3.0 volt signal level tends to cause such circuits to dissipate excessive amounts of power and energy over CMOS circuits utilizing the 1.8 volt signal level, the 1.8 volt CMOS circuit would be preferred in an application requiring reduced power consumption.

With the size of many electronic products becoming increasingly smaller, many electronic product designers are currently seeking to minimize power consumption. Generally, reducing the overall magnitude of rail-to-rail voltage swings of CMOS circuits allows a reduction in power consumption. Thus, an electronic architecture that would allow and work with lower input voltage swings without drawing leakage current is desirable. However, many applications of CMOS circuits still use 3.0 volt system power supplies which need to be accommodated. Consequently, an electronic system architectural concept is used whereby the nonvolatile writeable memory circuits operate with industry standard 1.8 volt and 3.0 volt CMOS I/O signal levels and utilize the optimum core supply voltage for the nonvolatile writeable memory core circuits.

Designers of prior art electronic systems incorporating nonvolatile writeable memory have attempted to reduce the overall system power consumption by running the entire system at the 1.8 volt I/O signal level and supply voltage. This increases the power efficiency of the system exclusive of the nonvolatile writeable memory. However, the nonvolatile writeable memory core memory circuits running at the 1.8 volt I/O signal level have a reduced power efficiency due to the inefficiencies of producing high voltages internal to the nonvolatile writeable memory. Thus, to effectively maximize efficiency of the overall electronic system, I/O interface buffers were designed to allow the nonvolatile writeable memory core memory circuits to be operated at a 3.0 volt I/O signal level, while the surrounding system CMOS circuitry is operated at a 1.8 volt I/O signal level. The 3.0 volt I/O nominal signal level can be approximately in the range 2.7 volts to 3.6 volts.

Designers of prior art electronic systems that operated at a 3.0 volt I/O signal level while using nonvolatile writeable memory used one power supply, commonly known as VCC. In order to prevent corruption of the data of the nonvolatile writeable memory, the prior art electronic systems utilized lockout circuitry. The lockout circuitry locked out spurious write commands to the command port of the nonvolatile writeable memory that were issued when the VCC voltage supply from was below a specified safe level, that level known heretofore as "V-lockout" or VLKO. On all prior art nonvolatile writeable memory devices, this lockout circuitry operated on the general nonvolatile writeable memory device power supply, VCC, only.

SUMMARY OF THE INVENTION

A power supply lockout circuit that prevents corruption of nonvolatile writeable memory data is described. The power supply lockout circuit monitors the power supply signals from several power supplies. The power supply lockout circuit locks out commands writing to the nonvolatile writeable memory when any one of the monitored power supply signals coupled to the nonvolatile writeable memory is below a specified signal level.

A method for locking out commands sent to a nonvolatile writeable memory is described. The method prevents corruption of the nonvolatile writeable memory by having the step of locking out a command to the nonvolatile writeable memory when any one of a number of monitored power supply signals is less than a specified signal level.

Other features and advantages of the present invention will be apparent from the accompanying drawings and from the detailed description and appended claims that follow below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Input/output (I/O) interface buffers that are designed to allow the nonvolatile writeable memory core circuits to operate at a 3.0 volt I/O signal level, while the surrounding system circuitry operates at a 1.8 volt I/O signal level require two separate power supply outputs. One power supply output, VCC, is used for general nonvolatile writeable memory power. The second power supply output, VCCQ, is used for the I/O drivers. Consequently, since these buffers use two power supplies, either of which could be used as the electronic system power supply, additional lockout circuitry is necessary to lock out write commands to the nonvolatile writeable memory when VCCQ is below a safe level. Thus, a power supply lockout circuit is provided that prevents corruption of nonvolatile writeable memory data by locking out commands writing to a nonvolatile writeable memory when any one of a plurality of power supply signals coupled to the nonvolatile writeable memory is below a specified signal level.

Figure 1:
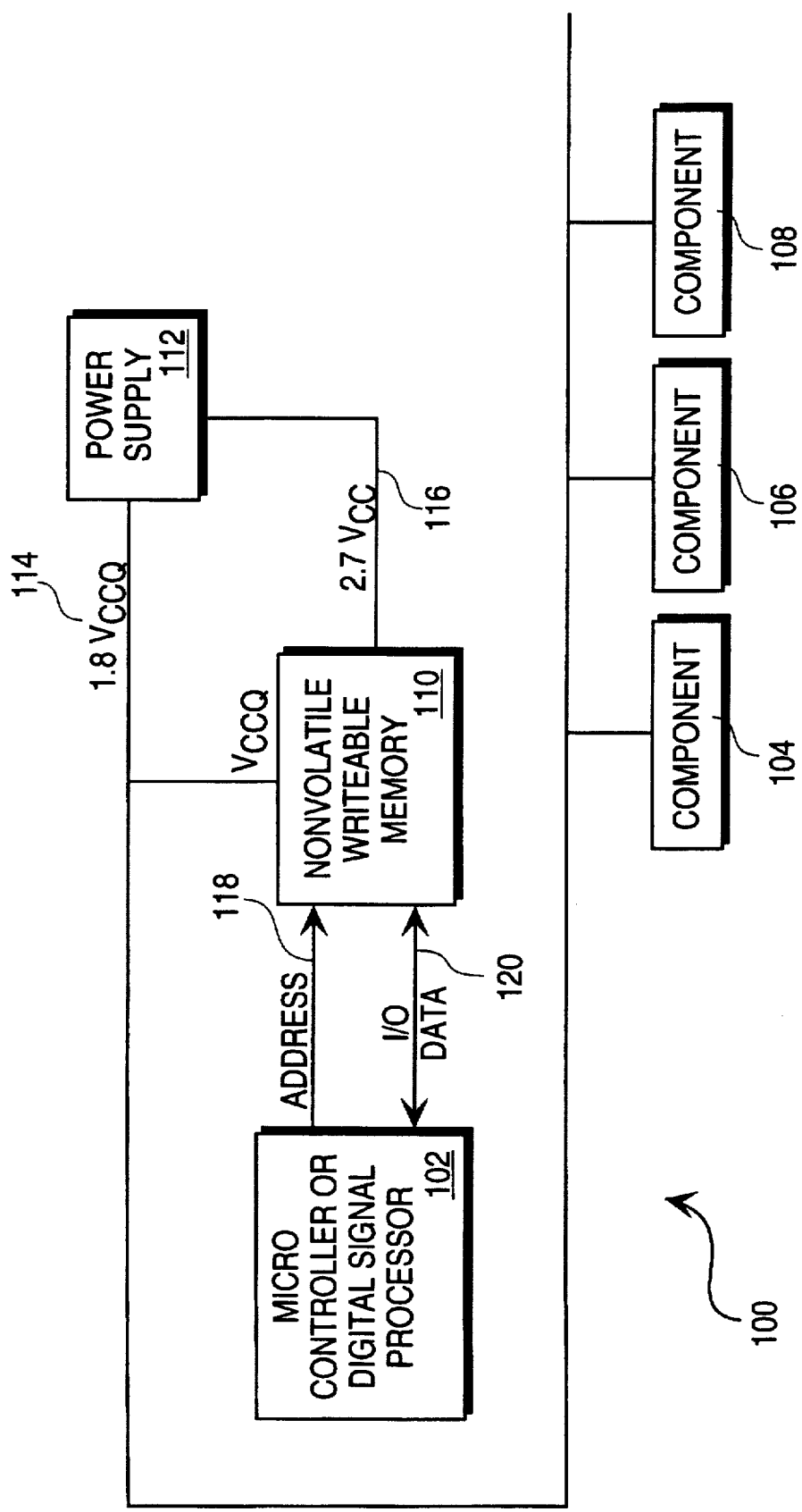
FIG. 1 shows a block diagram of a system level application including nonvolatile writeable memory.

FIG. 1 shows a block diagram of a system level application including nonvolatile writeable memory. This application includes a microcontroller or digital signal processor 102 and system components 104–108. System components 104–108 can be any other electronic components of the system 100 which, for example, might include but are not limited to additional memory components like static random access memory (SRAM), EPROM, and EEPROM. The microcontroller 102 communicates with the nonvolatile writeable memory 110 via address lines 118 and input/output (I/O) data lines 120. A first output of a power supply 112 provides a 1.8 volt supply (VCCQ) 114 to an interface circuit of the nonvolatile writeable memory 110 as well as to the system microcontroller 102, and system components 104–108. A second output of the power supply 112 provides a 2.7 volt supply (VCC) 116 to the core memory circuits of the nonvolatile writeable memory 110.

Figure 2:
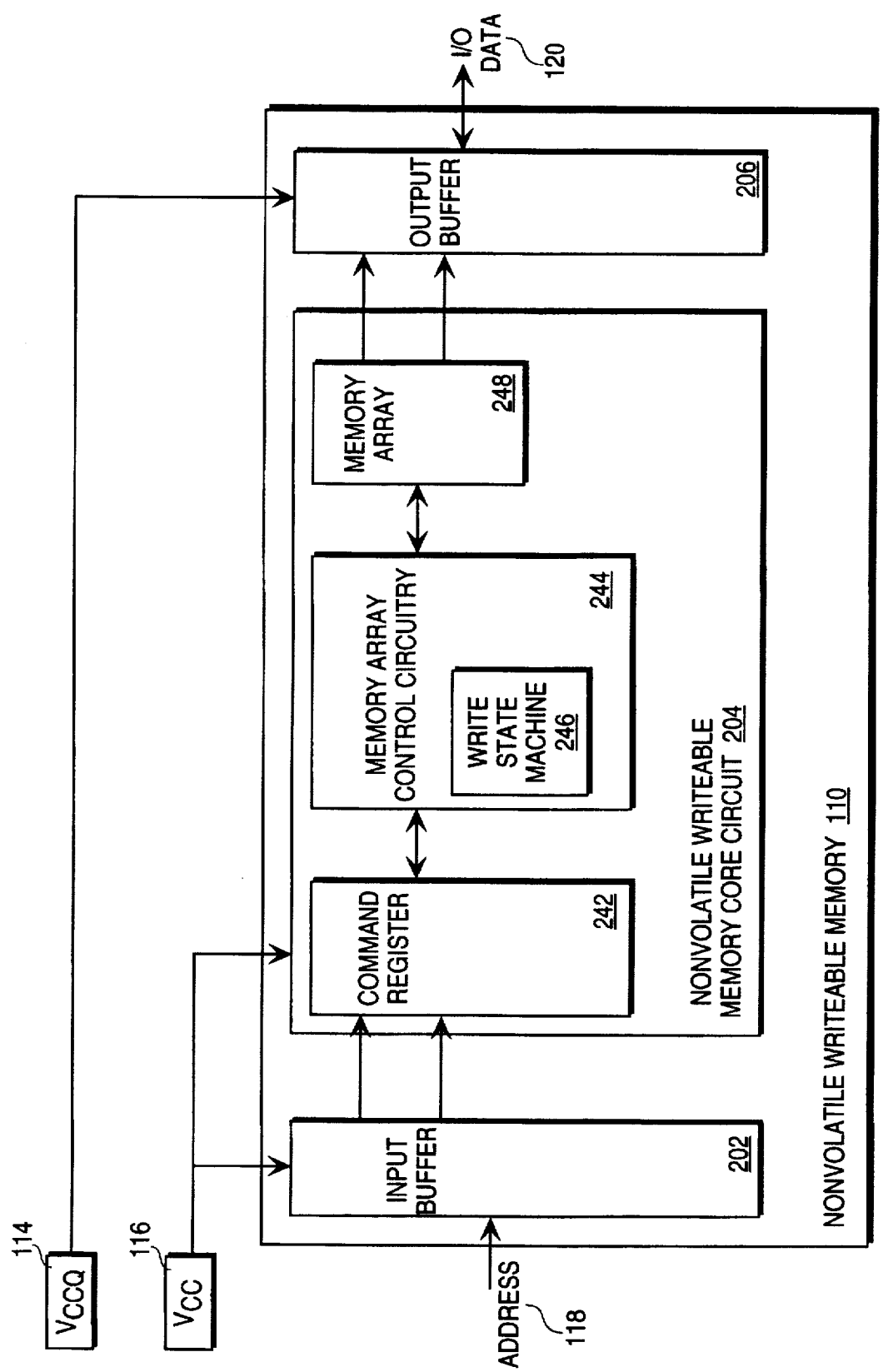
FIG. 2 shows a block diagram of a nonvolatile writeable memory.

FIG. 2 shows a block diagram of a nonvolatile writeable memory 110. This embodiment depicts the nonvolatile writeable memory 110 as being comprised of a 1.8/3.0 volt input bluffer 202 which automatically configures to either a 1.8 volt or a 3.0 volt input signal level, a nonvolatile writeable memory core circuit 204, and a 1.8/3.0 volt output buffer 206 which automatically configures to either a 1.8 volt or a 3.0 volt output signal level. The nonvolatile writeable memory core circuit 204 includes, but is not limited to, a command register 242, memory array control circuitry 244 including a write state machine 246, and a memory array 248.

An electronic system is coupled to the nonvolatile writeable memory 110 with address and control lines 118 which are coupled to the input buffer 202. The input buffer 202 is coupled to the nonvolatile writeable memory core circuit 204. The nonvolatile writeable memory core circuit 204 is coupled to the output buffer 206. The output buffer 206 is coupled to an electronic system using I/O data lines 120.

With regard to power supply connections, the input buffer 202 and the nonvolatile writeable memory core circuit 204 are each coupled to a VCC power supply 116. The output buffer 206 is coupled to a VCCQ power supply 114. The VCC power supply 116 and the VCCQ power supply 114 in combination power the nonvolatile writeable memory 110 and the electronic system in which the nonvolatile writeable memory 110 is resident.

Figure 3:
FIG. 3 shows the power supply combination supplied to an embodiment of a nonvolatile writeable memory.

FIG. 3 shows the power supply combination 300 supplied to an embodiment of a nonvolatile writeable memory by the VCC power supply 116 and the VCCQ power supply 114.

The interface circuitry of an embodiment of the nonvolatile writeable memory, including the input buffer 202 and the output buffer 206, is self-configuring to operate with a number of sets of signal levels. These signal levels are generally compatible with complementary metal-oxide semiconductor (CMOS) technology. For example, the nonvolatile writeable memory can utilize a signal having either a 1.8 volt or a 3.0 volt signal level.

With reference to FIGS. 2 and 3, when the interface circuitry including the input buffer 202 and the output buffer 206 is configured to utilize a 1.8 volt CMOS signal 302, the VCC power supply 116 to the input buffer 202 and the nonvolatile writeable memory core circuit 204 is approximately in the range of 2.7 to 2.85 volts 306, and the VCCQ power supply 114 to the output buffer 206 is approximately in the range of 1.8 to 2.2 volts 304. When the interface circuitry including the input buffer 202 and output buffer 206 is configured to utilize a 3.0 volt CMOS signal 312, the VCC power supply 116 to the input buffer 202 and the nonvolatile writeable memory core circuit 204 is substantially equal to 3.0 volts 316, and the VCCQ power supply 114 to the output buffer 206 is substantially equal to 3.0 volts 314.

Figure 4:
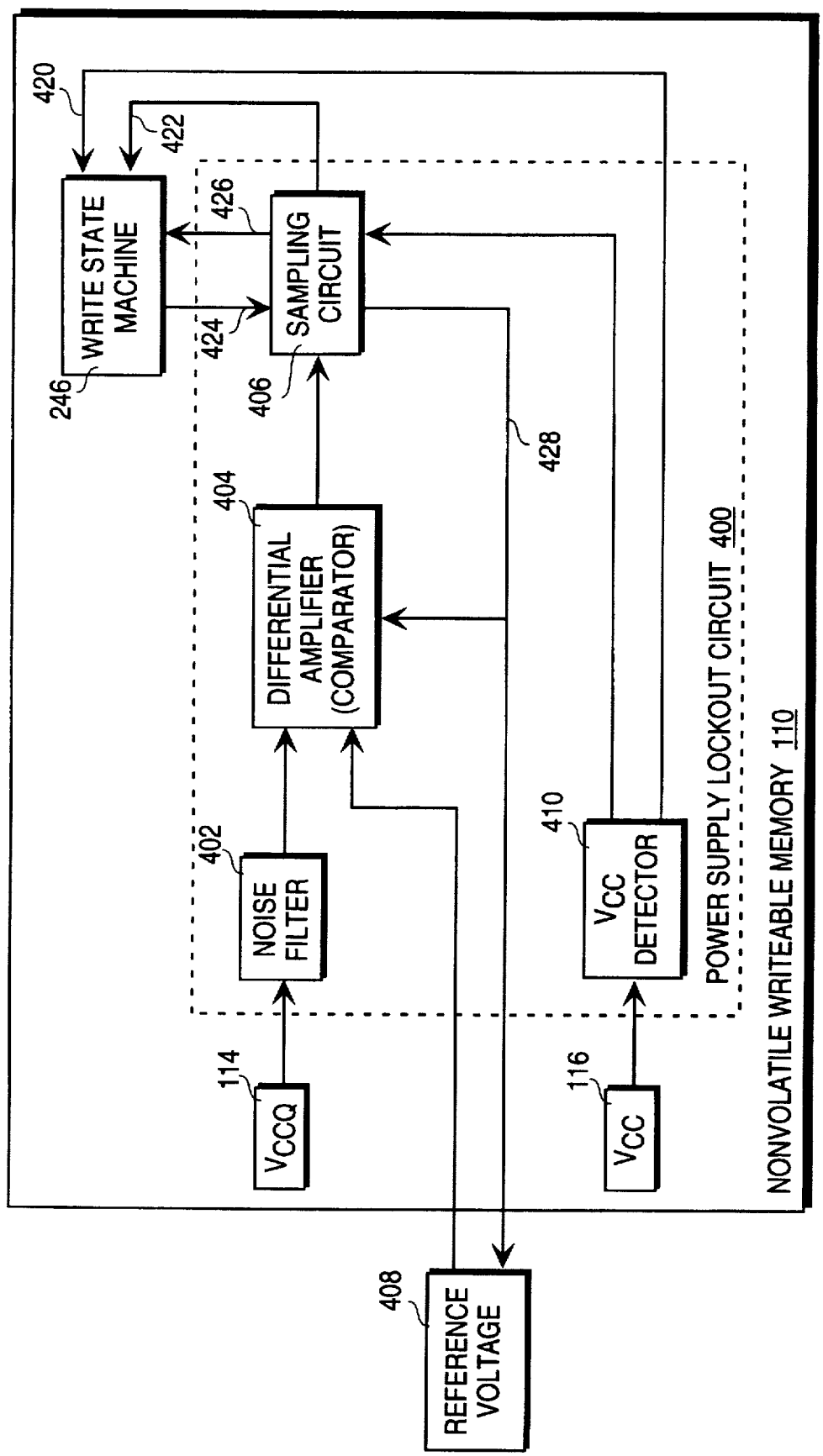
FIG. 4 shows a block diagram of an embodiment of a power supply lockout circuit.

FIG. 4 shows a block diagram of an embodiment of a power supply lockout circuit 400. In this embodiment, a nonvolatile writeable memory 110 has a VCCQ power supply 114 and a VCC power supply 116. The power supply lockout circuit 400 is coupled to the VCCQ power supply 114 and the VCC power supply 116 and is comprised of a sampling circuit 406, a differential amplifier 404, a noise filter 402, and a VCC detector 410. The VCCQ power supply 114 is coupled through a noise filter 402 to an input of the differential amplifier 404. A reference voltage 408 is coupled to another input of the differential amplifier 404. The output of the differential amplifier 404 is coupled to the sampling circuit 406. The sampling circuit 406 is coupled to the write state machine 246 of the nonvolatile writeable memory 110. The VCC power supply 116 is coupled through a VCC detector 410 to the sampling circuit 406. An output of the VCC detector 410 is also coupled to the write state machine 246 of the nonvolatile writeable memory 110.

The embodiment shown in FIG. 4 and described by example herein includes the power supply lockout circuit 400 on the same die with the nonvolatile writeable memory 110 and the power supplies. Alternate embodiments may have the power supply lockout circuit, the nonvolatile writeable memory, and the power supplies all on different dies. Furthermore, alternate embodiments may use the power supply lockout circuits with other types of memory devices.

In operation, the power supply lockout circuit 400 prevents corruption of the nonvolatile writeable memory 110 data by monitoring the power supply signals and by locking out commands writing to the nonvolatile writeable memory 110 when either of the power supply output signals 114 and 116 is below a specified signal level. The power supply lockout circuit 400 as described by example herein utilizes two approaches for locking out commands. A first approach is to protect against spurious write commands during the time period when the power supplies are first powering up. In this first approach, the power supply lockout circuit 400 utilizes lockout signals 420 and 422 which lock out the write commands to the nonvolatile writeable memory 110 when either of the two power supply signals 114 and 116 is below a specified signal level.

The second approach is to protect against spurious write commands in the situation where the power supplies have previously powered up and may not have maintained the specified output signal level. In this second approach, upon receipt of a write command by the nonvolatile writeable memory 110 in the absence of any lockout signals 420 and 422, the write state machine 246 transmits a polling signal 424 to the power supply lockout circuit 400. In response to the polling signal 424, the power supply lockout circuit 400 transmits a signal 426 to the nonvolatile writeable memory 110 which is indicative of the power supply signal levels. The write state machine 246 then determines whether to lock out the received write command based on the signal 426 received from the power supply lockout circuit 400. Each of these approaches will now be discussed in detail.

In the first approach used to protect against spurious write commands, the nonvolatile writeable memory 110 write state machine 246 utilizes lockout signals 420 and 422 received from the power supply lockout circuit 400. Any write commands received by the nonvolatile writeable memory 110 while either lockout signal is active are locked out, or not accepted, by the write state machine 246. Lockout signal 420 is a VCC lockout signal. Lockout signal 422 is a VCCQ lockout signal. The VCC lockout signal 420 is received by the write state machine 246 from the VCC detector 410. The VCC detector 410 is configured to generate the active VCC lockout signal 420 when the VCC signal is at a level that is less than a prespecified level. In one embodiment, the prespecified level is approximately 2.0 volts when the VCC signal level is substantially in the range of 2.7 volts to 3.0 volts. The active signal from the VCC detector 410 is transmitted over the VCC lockout line 420 to the write state machine 246. This VCC lockout signal 420 is indicative of the VCC power supply 116 not providing an acceptable signal level. Any write commands received by the nonvolatile writeable memory 110 while the VCC lockout signal 420 is active are locked out by the write state machine 246. The absence of a VCC lockout signal 420 is representative of the VCC power supply 116 providing an acceptable output signal level.

The VCCQ lockout signal 422 is received by the write state machine 246 when generated by the sampling circuit 406. The VCC detector 410 is configured so that when the VCC power supply 116 is not providing an acceptable signal level, an active preset signal is transmitted to the sampling circuit 406. This active preset signal presets the sampling circuit 406. The preset sampling circuit 406 transmits an active signal over the VCCQ lockout line 422 to the write state machine 246. This VCCQ lockout signal 422 indicates to the write state machine 426 that either the VCC power supply 116 or the VCCQ power supply 114 is not providing an acceptable output signal level. Any write commands received by the nonvolatile writeable memory 110 while the VCCQ lockout signal 422 is active are locked out by the write state machine 246. The active preset signal from the VCC detector 410 also causes the sampling circuit 406 to transmit an active signal over signal line 428 to a reference voltage 408 and a differential amplifier 404. This signal forces the reference voltage 408 and the differential amplifier 404 to an "on" state.

When the VCC power supply 116 is at an acceptable level the preset signal is deactivated and the VCC detector 410 is turned "off" in order to reduce power consumption. However, the active signal over signal line 428 causes the reference voltage 408 and the differential amplifier 404 to remain "on" until the VCCQ signal 114 level is at an acceptable level. With the reference voltage 408 and differential amplifier 404 "on", the sampling circuit 406 utilizes the output of the differential amplifier 404 to determine the VCCQ signal 114 level. The VCCQ signal 114 level is input to the differential amplifier 404 along with a reference signal which is output from the reference voltage 408. The reference voltage is selected as a voltage level at which stable operation of the circuits powered by the VCCQ power supply is insured. In this example embodiment, the reference voltage is approximately 1.2 volts.

The differential amplifier 404 functions as a comparator and, as such, outputs a signal when the voltage level of the VCCQ signal 114 exceeds the voltage level of the reference voltage. In this embodiment, the differential amplifier 404 will output a signal when the VCCQ signal 114 level is equal to or greater than 1.2 volts. A signal received from the differential amplifier 404 resets the sampling circuit 406. When the sampling circuit 406 is reset no VCCQ lockout signal 422 is generated because both the VCC and the VCCQ signals are at acceptable levels. Moreover, when VCCQ reaches an acceptable level, the sampling circuit 406 ceases transmitting the active signal over signal line 428 which turns both the reference voltage 408 and the differential amplifier 404 "off" in order to reduce power consumption.

When the VCC power supply 116 is at an acceptable level and no signal is received from the differential amplifier 404 then the sampling circuit 406 is not reset. In this condition, the sampling circuit 406 continues to transmit an active VCCQ lockout signal 422 indicating that the VCCQ signal 114 is not at an acceptable level. This VCCQ lockout signal 422 in the absence of a VCC lockout signal 420 indicates to the write state machine 246 that the VCCQ power supply 114 is not providing an acceptable signal level. Any write commands received by the nonvolatile writeable memory 110 while the VCCQ lockout signal 422 is active are locked out by the write state machine 246. Furthermore, the sampling circuit 406 causes the reference voltage 408 and the differential amplifier 404 to remain "on" until the VCCQ signal 114 level rises above the reference signal voltage at which time the sampling circuit 406 is reset.

An alternate embodiment couples the VCC lockout signal 420 and the VCCQ lockout signal 422 to the write state machine 246 of the nonvolatile writeable memory 110 using an OR logic gate. In this embodiment, the VCC lockout signal 420 is one input to the OR gate and the VCCQ lockout signal 422 is a different input to the OR gate. The output of the OR gate is coupled to the write state machine 246. Thus, any write commands received by the nonvolatile writeable memory 110 while either the VCC lockout signal 420 or the VCCQ lockout signal is active are locked out by the write state machine 246.

Figure 5:
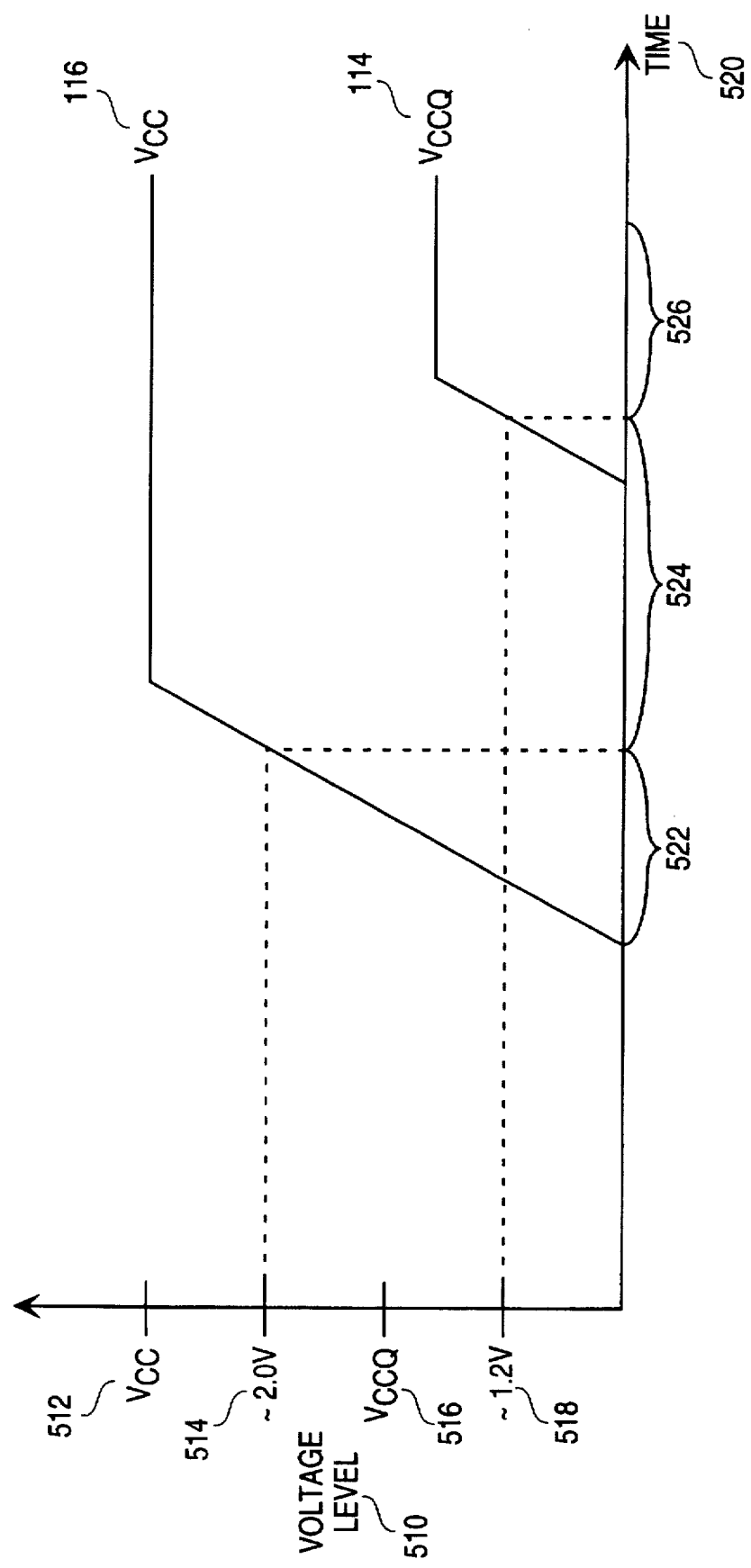
FIG. 5 shows the voltage level versus time waveforms of the VCC signal and the VCCQ signal used in an embodiment of a nonvolatile writeable memory in the combination where VCC comes up to a specified level before VCCQ.
Figure 6:
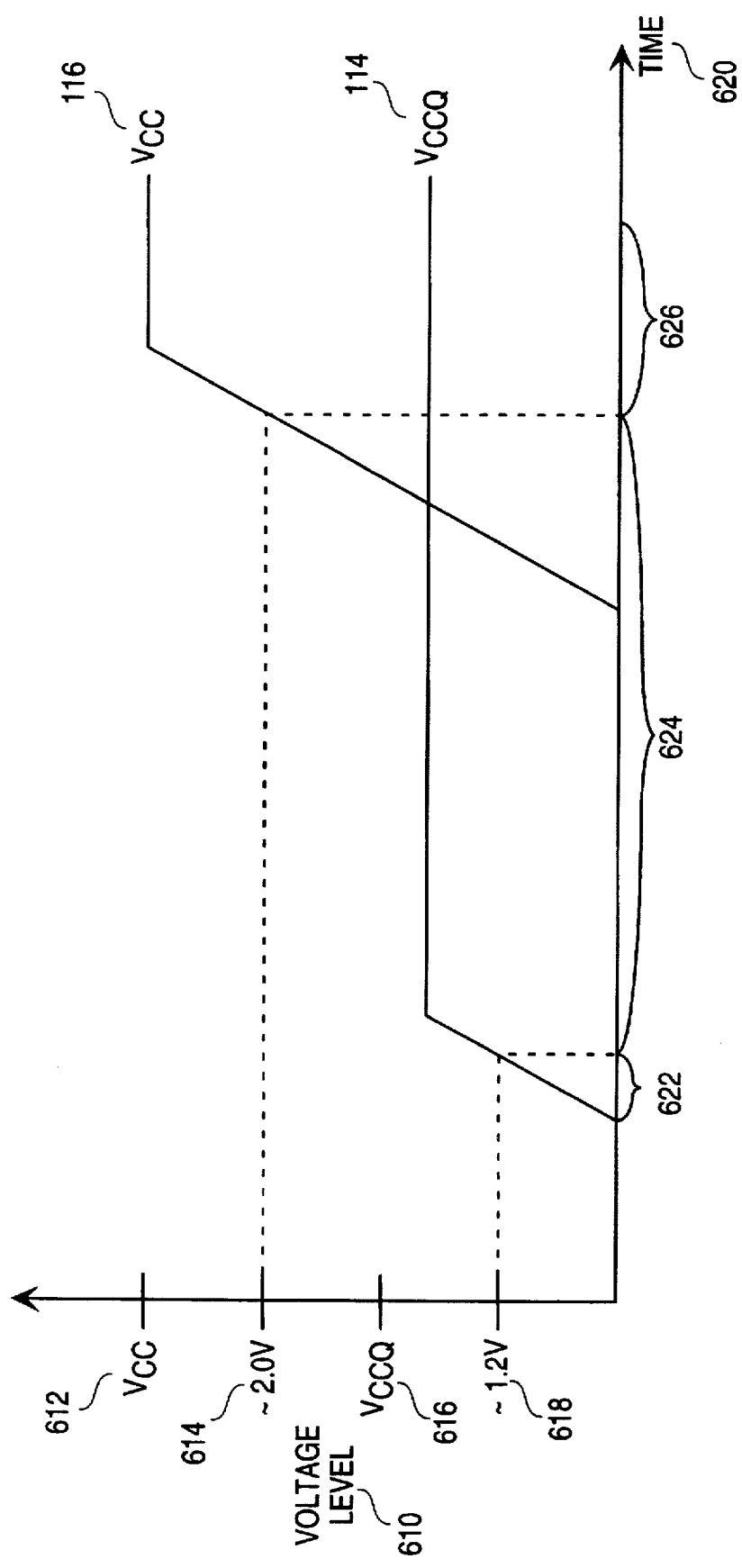
FIG. 6 shows the voltage level versus time waveforms of the VCC signal and the VCCQ signal used in an embodiment of a nonvolatile writeable memory in the combination where VCCQ comes up to a specified level before
Figure 7:
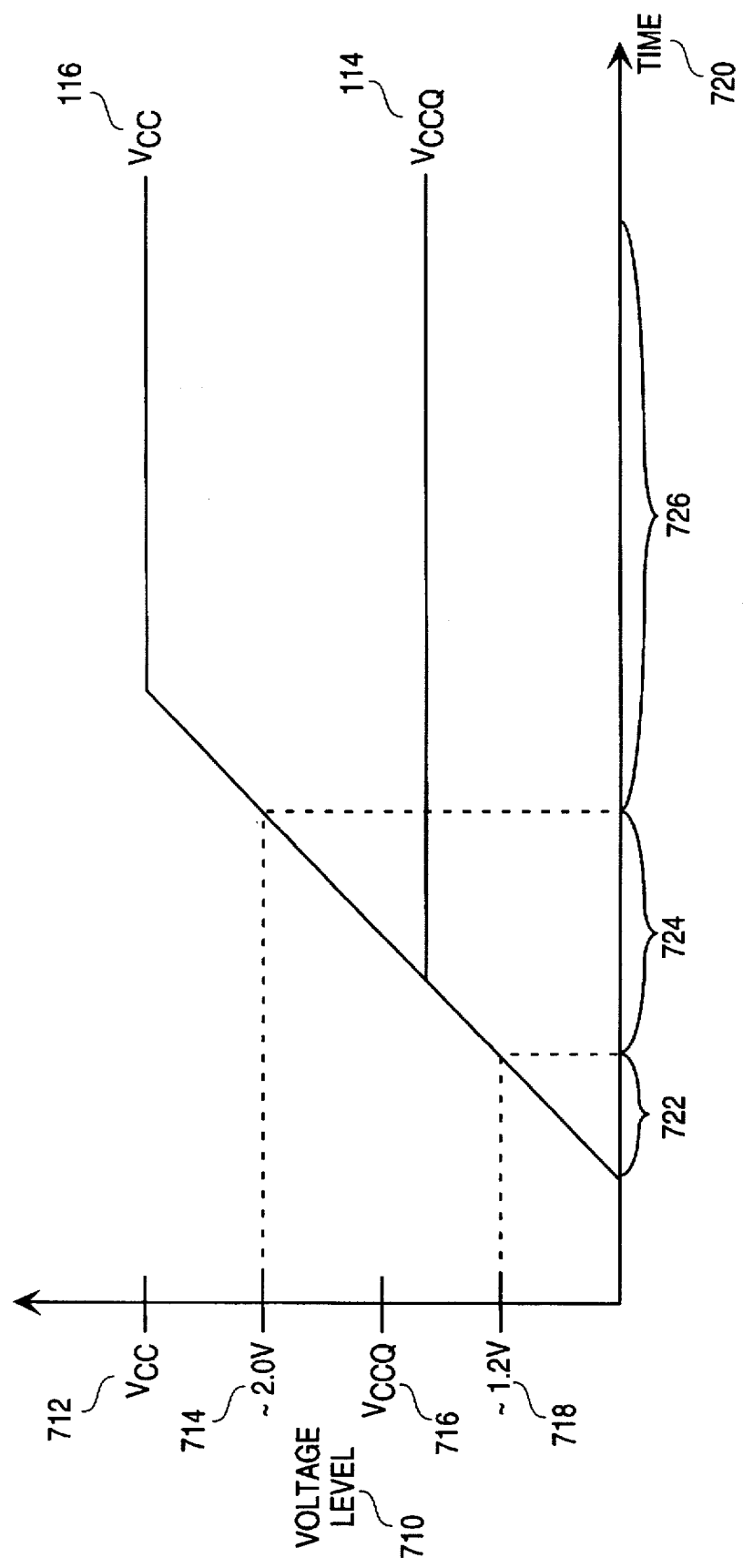
FIG. 7 shows the voltage level versus time waveforms of the VCC signal and the VCCQ signal used in an embodiment of a nonvolatile writeable memory in the combination where both VCC and VCCQ come up at the same time.

This first approach used by the power supply lockout circuit protects against spurious write commands in the possible combinations in which the number of power supplies used initially come up to specified output signal levels. When using a VCC and a VCCQ power supply, there are four such combinations. These combinations are that neither supply comes up to a specified level, VCC comes up to a specified level before VCCQ, VCCQ comes up to a specified level before VCC, and both VCC and VCCQ come up at the same time. The first combination is that neither VCC nor VCCQ supply a signal. As neither VCC nor VCCQ output a signal, then both the VCC lockout signal and the VCCQ lockout signal are active, thereby locking out write commands to the nonvolatile writeable memory. FIGS. 5, 6, and 7 show the voltage level versus time waveforms of the VCC output signal and the VCCQ output signal for the remaining three power up combinations of the VCC and the VCCQ power supplies.

FIG. 5 shows the voltage level 510 versus time 520 waveforms of the VCC signal 116 and the VCCQ signal 114 used in an embodiment of a nonvolatile writeable memory 110 in the combination where VCC comes up to a specified level before VCCQ. During time period 522, the VCC signal 116 level is less than a prespecified level 514. The prespecified level 514 is chosen in this embodiment to be approximately 2.0 volts, but is not limited to this value. Accordingly, the VCC lockout signal 420 is active during time period 522, thereby locking out write commands to the nonvolatile writeable memory 110. Furthermore, the sampling circuit 406 is preset as a result of the inadequate VCC signal level which causes the VCCQ lockout signal 422 to also be active during time period 522. Thus, any write commands received by the nonvolatile writeable memory 110 during time period 522 are locked out by the write state machine 246.

During time period 524, the VCC signal is greater than a prespecified level 514 and thus no VCC lockout signal is transmitted to the nonvolatile writeable memory 110. The VCC signal 116 level being above the prespecified level 514 causes cessation of the transmission of the preset signal to the sampling circuit 406. However, as the VCCQ signal 114 level is less than the reference voltage level 518, the sampling circuit 406 continues transmission of a VCCQ lockout signal 422 to the nonvolatile writeable memory 110 thereby locking out write commands to the nonvolatile writeable memory 110 during time period 524.

During time period 526, the VCC signal is greater than a prespecified level 514 and no VCC lockout signal is transmitted to the nonvolatile writeable memory. The adequate VCC signal level also causes cessation of the transmission of the preset signal to the sampling circuit 406. The VCCQ signal 116 level is greater than the reference voltage level 518 which results in the resetting of the sampling circuit 406. Thus, no VCCQ lockout signal is transmitted to the nonvolatile writeable memory 110. Accordingly, write commands received by the nonvolatile writeable memory 110 during time period 526 are not locked out.

FIG. 6 shows the voltage level 610 versus time 620 waveforms of the VCC signal 116 and the VCCQ signal 114 used in an embodiment of a nonvolatile writeable memory 110 in the combination where VCCQ comes up to a specified level before VCC. During time period 622 the VCC has no output signal so the VCC signal 116 level is less than a prespecified level 614. This prespecified level 614 is chosen in this embodiment to be approximately 2.0 volts, but is not limited to this value. Thus, the VCC lockout signal 420 is active during time period 622 thereby locking out write commands to the nonvolatile writeable memory 110. Furthermore, the inadequate VCC signal level results in the transmission of a preset signal to the sampling circuit 406 which causes the VCCQ lockout signal 422 to also be active during time period 622. Accordingly, write commands to the nonvolatile writeable memory 110 are locked out during time period 622.

During time period 624, the VCCQ signal has risen to a level greater than a reference signal level 618. However, the VCC signal remains less than a prespecified level 614 which causes the VCC lockout signal 420 to remain active. Furthermore, the inadequate VCC signal 116 level results in the transmission of a preset signal to the sampling circuit 406. When the sampling circuit 406 is preset, the sampling circuit 406 can not be reset by a VCCQ signal that is greater than a reference signal. Thus, the sampling circuit 406 continues to transmit a VCCQ lockout signal to the nonvolatile writeable memory 110 despite the adequate level of the VCCQ signal thereby locking out write commands to the nonvolatile writeable memory 110 during time period 624.

During time period 626, the VCC signal has risen to a level greater than a prespecified level 614. At such time as the VCC signal exceeds the prespecified level 614 the VCC lockout signal 420 is deactivated. The adequate -level of the VCC signal 116 level also causes cessation of the transmission of the preset signal to the sampling circuit 406. As the VCCQ signal 114 level is greater than the reference voltage level 618 at the time the preset signal ceases to be received at the sampling circuit 406, the sampling circuit 406 is reset. Thus, the reset sampling circuit 406 causes the VCCQ lockout signal 422 to be deactivated thereby allowing write commands to the nonvolatile writeable memory 110 during time period 626.

FIG. 7 shows the voltage level 710 versus time 720 waveforms of the VCC signal 116 and the VCCQ signal 114 used in an embodiment of a nonvolatile writeable memory 110 in the combination where both VCC and VCCQ come up at the same time. During time period 722 the VCC signal 116 level is less than a prespecified level 714. This prespecified level 714 is chosen in this embodiment to be approximately 2.0 volts, but is not limited to this value. Thus, the VCC lockout signal 420 is active during time period 722 thereby locking out write commands to the nonvolatile writeable memory 110. Furthermore, the inadequate VCC signal 116 level results in the transmission of a preset signal to the sampling circuit 406 which causes the VCCQ lockout signal 422 to also be active during time period 722. Accordingly, write commands to the nonvolatile writeable memory 110 are locked out during time period 722.

During time period 724, the VCCQ signal has risen to a level greater than a reference signal level 718. However, despite powering up at the same time, the VCC signal remains less than a prespecified level 714. This is because VCC must rise to a higher signal level than VCCQ, so VCC will require more time to reach the higher signal level. As such, the VCC lockout signal 420 remains active. Furthermore, the inadequate VCC signal 116 level results in the transmission of a preset signal to the sampling circuit 406. When the sampling circuit 406 is preset, the sampling circuit 406 can not be reset by a VCCQ signal that is greater than a reference signal. Thus, the sampling circuit 406 continues to transmit a VCCQ lockout signal 422 to the nonvolatile writeable memory 110 despite the adequate level of the VCCQ output signal thereby locking out write commands to the nonvolatile writeable memory 110 during time period 724.

During time period 726, the VCC signal has risen to a level greater than a prespecified level 714. At such time as the VCC signal exceeds the prespecified level 714 the VCC lockout signal 420 is deactivated. The adequate level of the VCC signal 116 level also causes cessation of the transmission of the preset signal to the sampling circuit 406. As the VCCQ signal 114 level is greater than the reference voltage level 718 at the time the preset signal ceases to be received at the sampling circuit 406, the sampling circuit 406 is reset. Thus, the reset sampling circuit 406 causes the VCCQ lockout signal 422 to be deactivated thereby allowing write commands to the nonvolatile writeable memory 110 during time period 726.

Referring again to FIG. 4, in the second approach used to protect the nonvolatile writeable memory against spurious write commands it is presumed that the two power supplies have previously powered up to adequate signal levels. As such, the VCC signal 116 level is above the prespecified level and the VCCQ signal 114 level is above the reference signal level. In this situation, there is no VCC lockout signal 420 and no VCCQ lockout signal 422 transmitted to the nonvolatile writeable memory 110 by the power supply lockout circuit 400. When the nonvolatile writeable memory 110 receives a write command it causes the write state machine 246 to transmit a polling signal 424 to the power supply lockout circuit 400. The sampling circuit 406 of the power supply lockout circuit 400 transmits a signal 426 to the write state machine 246 in response to the polling signal 424. The signal 426 is indicative of both the VCC and the VCCQ signal levels.

In this second approach, the VCC detector 410 is configured so that when the VCC power supply is not providing an acceptable output signal level, a preset signal is transmitted to the sampling circuit 406. This active preset signal presets the sampling circuit 406. The preset sampling circuit 406 transmits a signal to the write state machine 246 over line 426 in response to the polling signal 424. This signal indicates to the write state machine 246 that the VCC power supply 116 is not providing an acceptable output signal level. As a result of receiving this signal, write commands received by the nonvolatile writeable memory 110 are locked out by the write state machine 246.

When the VCC power supply 116 is at an acceptable level then no preset signal is transmitted to the sampling circuit 406. As such, the sampling circuit 406 utilizes the output of a differential amplifier 404 to determine the VCCQ signal 114 level. The VCCQ signal 114 level is input to a differential amplifier 404 along with a reference signal. The reference signal is output from a reference voltage 408. The differential amplifier 404 functions as a comparator and, as such, outputs a signal when the voltage level of the VCCQ signal 114 exceeds the voltage level of the reference signal. In this embodiment, the differential amplifier 404 will output a signal when the VCCQ signal 114 level is equal to or greater than 1.2 volts. When the sampling circuit 406 is not receiving a preset signal from the VCC detector 410, a signal received from the differential amplifier 404 resets the sampling circuit 406. When the sampling circuit 406 is reset it transmits a signal to the write state machine 246 over line 426 in response to the polling signal 424. This signal indicates to the write state machine 246 that both the VCC power supply 116 and the VCCQ power supply 114 signals are at acceptable signal levels. As a result of receiving this signal, write commands received by the nonvolatile writeable memory 110 are not locked out by the write state machine 110.

When the sampling circuit 406 is not receiving a preset signal from the VCC detector 410 and no signal is received from the differential amplifier 404, then the sampling circuit 406 is not reset. As such, the sampling circuit 406 is not reset until the VCCQ signal 114 level rises above the reference signal voltage. The sampling circuit 406 not being in a reset condition indicates that the VCCQ signal 114 is not at an acceptable level and a signal indicative of this condition is transmitted to the write state machine 246 over line 426 in response to the polling signal 424. This signal indicates to the write state machine 246 that the VCCQ power supply 114 is not providing an acceptable output signal level. As a result of receiving this signal, write commands received by the nonvolatile writeable memory 110 are locked out by the write state machine 110.

Thus, a power supply lockout circuit has been provided that prevents corruption of nonvolatile writeable memory data by locking out commands writing to a nonvolatile writeable memory when any one of a plurality of power supply output signals coupled to the nonvolatile writeable memory is below a specified signal level. While the detailed description describes embodiments using a flash EPROM, the invention may be used with any nonvolatile writeable memory, including, but not limited to, EPROMs, EEPROMs, and flash memories, including technologies such as NOR, NAND, AND, Divided bit-line NOR (DINOR), and Ferro-electric Random Access Memory (FRAM).

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A nonvolatile memory comprising a lockout circuit, the lockout circuit monitoring a plurality of power supply signals and locking out write commands to the nonvolatile memory when one of the plurality of power supply signals is below a specified signal level, wherein the lockout circuit prevents corruption of nonvolatile memory data.

2. The nonvolatile memory of claim 1, wherein the lockout circuit further comprises:
   a detector coupled to provide a first lockout signal to the nonvolatile memory when a first power supply signal is less than a prespecified voltage; and
   a sampling circuit coupled to provide a second lockout signal to the nonvolatile memory when a second power supply signal is less than a reference voltage.

3. The nonvolatile memory of claim 2, wherein the sampling circuit provides a lockout signal to the nonvolatile memory when a first power supply signal is less than a prespecified voltage.

4. The nonvolatile memory of claim 2, wherein a differential amplifier is coupled to provide an output signal to the sampling circuit when a second power supply signal level is greater than a reference voltage.

5. The nonvolatile memory of claim 2, wherein a detector is coupled to provide a second output signal to the sampling circuit when the first power supply signal level is less than a prespecified voltage.

6. The nonvolatile memory of claim 2, wherein the sampling circuit receives polling signals from the nonvolatile memory, the polling signals transmitted in response to a write command received at the nonvolatile memory.

7. The nonvolatile memory of claim 6, wherein the sampling circuit is coupled to provide at least one signal to the nonvolatile memory in response to the polling signal, the at least one signal representative of an output signal level of the plurality of power supplies.

8. The nonvolatile memory of claim 2, wherein the reference voltage is substantially equal to 1.2 volts.

9. The nonvolatile memory of claim 2, wherein the sampling circuit is a voltage sampling circuit.

10. The nonvolatile memory of claim 2, wherein the detector and the sampling circuit are coupled to the nonvolatile memory using a logic OR gate, the nonvolatile memory locking out write commands when a signal is received from the logic OR gate.

11. The nonvolatile memory of claim 2, wherein the state of the detector is controlled by the first power supply signal level.

12. The nonvolatile memory of claim 4, wherein the state of the differential amplifier and the reference signal is controlled by the second power supply signal level.

13. A method for locking out commands sent to a nonvolatile memory, the method preventing corruption of the nonvolatile writeable memory by having comprising the step of locking out a write command to the nonvolatile memory when any one of a plurality of power supply signals is less than a specified signal level, wherein corruption of the nonvolatile memory is prevented.

14. A method for locking out commands sent to a nonvolatile memory, the method comprising the steps of:
   receiving a command at the nonvolatile memory;
   polling a sampling circuit as to a signal level of at least one of a plurality of power supplies;
   comparing the signal level of at least one of the plurality of power supplies to a reference signal;
   receiving at least one signal representative of the signal level of at least one of the plurality of power supplies;
   locking out a write command to the nonvolatile memory when any one of the plurality of power supply signals is below a specified signal level.

15. The method of claim 14, wherein the sampling circuit is a voltage sampling circuit.

16. The method of claim 14, wherein the commands are write commands.

17. The method of claim 14, wherein the commands are program commands.

18. The method of claim 14, wherein a differential amplifier compares the signal level of at least one of the plurality of power supplies to the reference signal.

19. The method of claim 18, wherein the state of the differential amplifier and the reference signal is controlled by a first power supply signal level.

20. The method of claim 14, wherein a detector is coupled to the nonvolatile memory, the detector causing the nonvolatile memory to lock out write commands when a first power supply signal level is outside of a predetermined range.

21. The method of claim 20, wherein the detector and the sampling circuit are coupled to the nonvolatile memory using a logic OR gate, the nonvolatile memory locking out write commands when a signal is received from the logic OR gate.

22. The method of claim 20, wherein the state of the detector is controlled by the first power supply signal level.

23. The method of claim 14, wherein the sampling circuit causes the nonvolatile memory to lock out write commands when a second power supply signal level is less than the reference signal level.

24. The method of claim 14, wherein the nonvolatile memory polls the sampling circuit as to the signal level of the plurality of power supply signals.

25. The method of claim 24, wherein the nonvolatile memory receives at least one signal representative of the signal level of the plurality of power supplies.

26. The method of claim 24, wherein the sampling circuit causes the nonvolatile memory to lock out write commands when the first power supply signal level is outside of a predetermined range.

27. The method of claim 24, wherein the sampling circuit causes the nonvolatile memory to lock out write commands when the second power supply signal level is less than the reference signal level.

28. The method of claim 23, wherein the reference signal is substantially equal to 1.2 volts.

* * * * *